(12) United States Patent
Vandemeer et al.

(10) Patent No.: US 9,688,529 B2
(45) Date of Patent: Jun. 27, 2017

(54) GLASS WAFER ASSEMBLY

(71) Applicant: RF Micro Devices, Inc., Greensboro, NC (US)

(72) Inventors: Jan Edward Vandemeer, Mesa, AZ (US); Jonathan Hale Hammond, Oak Ridge, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/718,408

(22) Filed: May 21, 2015

(65) Prior Publication Data

US 2015/0353348 A1 Dec. 10, 2015

Related U.S. Application Data

(60) Provisional application No. 62/009,983, filed on Jun. 10, 2014.

(51) Int. Cl.
*B81B 3/00* (2006.01)
*B81B 7/00* (2006.01)
*B81C 1/00* (2006.01)

(52) U.S. Cl.
CPC ........ *B81B 7/0006* (2013.01); *B81C 1/00269* (2013.01); *B81C 1/00301* (2013.01); *B81B 2201/014* (2013.01); *B81B 2207/092* (2013.01); *B81B 2207/095* (2013.01);
(Continued)

(58) Field of Classification Search
CPC .................................................. B81B 7/0074
See application file for complete search history.

(56) References Cited

U.S. PATENT DOCUMENTS

| | | | |
|---|---|---|---|
| 7,230,512 B1* | 6/2007 | Carpenter | H03H 3/08 333/133 |
| 2003/0104651 A1* | 6/2003 | Kim | B81C 1/00269 438/106 |

(Continued)

OTHER PUBLICATIONS

Lee, J.Y. et al., "Fabrication of void-free copper filled through-glass-via for wafer-level RF MEMS packaging," Electronic Letters, Institution of Engineering and Technology, vol. 48, Issue 17, Aug. 16, 2012, pp. 1076-1077.
(Continued)

*Primary Examiner* — William Harriston
(74) *Attorney, Agent, or Firm* — Withrow & Terranova, P.L.L.C.

(57) ABSTRACT

A glass wafer assembly is disclosed. In one aspect, the glass wafer assembly comprises a first glass wafer and a second glass wafer that are bonded by a conductive sealing ring. The conductive sealing ring defines a substantially hermetically sealed cavity between the first glass wafer and the second glass wafer. In another aspect, the first glass wafer and the second glass wafer each comprise a plurality of conductive through glass vias (TGVs). At least one active device is disposed in the substantially hermetically sealed cavity and can be electrically coupled to a conductive TGV in the first glass wafer and a conductive TGV in the second glass wafer to enable flexible electrical routing through the glass wafer assembly without wire bonding and over molding. As a result, it is possible to reduce footprint and height while improving radio frequency (RF) performance of the glass wafer assembly.

5 Claims, 8 Drawing Sheets

(52) U.S. Cl.
CPC . *B81B 2207/096* (2013.01); *B81C 2203/0109* (2013.01); *B81C 2203/035* (2013.01)

(56) References Cited

U.S. PATENT DOCUMENTS

| | | | | |
|---|---|---|---|---|
| 2008/0029863 A1* | 2/2008 | Eskridge | ............ | B81C 1/00301 257/678 |
| 2010/0003772 A1* | 1/2010 | Carlson | ............... | B81C 1/00269 438/18 |
| 2014/0124899 A1* | 5/2014 | Gooch | ................ | B81C 1/00269 257/620 |

OTHER PUBLICATIONS

Lee, J.Y. et al., "Wafer level packaging for RF MEMS devices using void free copper filled through glass via," 2013 IEEE 26th International Conference on Micro Electro Mechanical Systems (MEMS), IEEE, Jan. 20-24, 2013, Taipei, Taiwan, pp. 773-776.

Nicolas, S. et al., "3D MEMS High Vacuum Wafer Level Packaging," 2012 IEEE 62nd Electronic Components and Technology Conference (ECTC), IEEE, May 29-Jun. 1, 2012, San Diego, CA, pp. 370-376

Sun, X. et al., "Design of RF MEMS phase shifter packaging based on through glass via (TGV) interposer," 2012 13th International Conference on Electronic Packaging Technology & High Density Packaging (ICEPT-HDP), IEEE, Aug. 13-16, 2012, Guilin, China, pp. 808-810.

Sutanto, J. et al., "Development of Chip-on-Chip with Face to Face Technology as a Low Cost Alternative for 3D Packaging," 2013 IEEE 63rd Electronic Components & Technology Conference (ECTC), IEEE, May 28-31, 2013, Las Vegas, Nevada, pp. 955-965.

* cited by examiner

GLASS WAFER ASSEMBLY

RELATED APPLICATIONS

This application claims the benefit of U.S. provisional patent application Ser. No. 62/009,983 filed Jun. 10, 2014, the disclosure of which is incorporated herein by reference in its entirety.

FIELD OF THE INVENTION

The present invention relates to three-dimensional (3D) packaging solutions, and in particular to 3D packaging solutions comprising glass wafers.

BACKGROUND OF THE INVENTION

Computing devices such as smartphones have become common in modern society. The prevalence of computing devices may be attributed to the many functions that are enabled within such computing devices. As the computing devices evolve, there is an increased need for high performance active devices that are provided on various substrates along with other semiconductor components to form various types of circuits. These high performance active devices often act as relays, and are generally referred to as microelectro-mechanical system (MEMS) devices. MEMS devices are currently being considered in many radio frequency (RF) applications, such as antenna switches, load switches, transmit/receive switches, tuning switches, and the like.

Increasingly complex packaging solutions have been designed and manufactured to provide greater functionality in computing devices. Final packaging solutions of the computing devices may be provided as two-dimensional (2D) packaging solutions or three-dimensional (3D) packaging solutions. In this regard, FIG. 1A is a schematic diagram of an exemplary 2D packaging solution 10 comprising a MEMS substrate 12 disposed side-by-side of an application-specific integrated circuit (ASIC) 14.

With reference to FIG. 1A, the MEMS substrate 12 and the ASIC 14 are provided on a laminate 16. The MEMS substrate 12 is bonded to a cap wafer 18. A cavity 20 is formed between the cap wafer 18 and the MEMS substrate 12 to encapsulate one or more MEMS devices (not shown). The MEMS substrate 12 and the ASIC 14 are electrically coupled to the laminate 16 by bonding wires 22 and 24, respectively. The MEMS substrate 12 is electrically coupled to the ASIC 14 via a bonding wire 26. An over molding layer 28 is provided in the 2D packaging solution 10 to protect the bonding wires 22, 24, and 26. The over molding layer 28 covers the MEMS substrate 12, the cap wafer 18, and the ASIC 14 in the 2D packaging solution 10.

Because the MEMS substrate 12 and the ASIC 14 are disposed side-by-side on the laminate 16, the 2D packaging solution 10 has a relatively larger footprint. In addition, the over molding layer 28 increases the height of the 2D packaging solution 10. In this regard, FIG. 1B is a schematic diagram of an exemplary 3D packaging solution 30 wherein the MEMS substrate 12 and the ASIC 14 are stacked to have a reduced footprint as compared to the footprint of the 2D packaging solution 10 of FIG. 1A. Common elements between FIGS. 1A and 1B are shown therein with common element numbers and will not be re-described herein.

The MEMS substrate 12 in the 3D packaging solution 30 comprises at least one conductive through glass via (TGV) 31 that electrically couples the MEMS substrate 12 to the laminate 16 using at least one conductive pad 32. As illustrated in FIG. 1B, a bonding wire 33 is still required to electrically couple the ASIC 14 to the at least one TGV 31 in the MEMS substrate 12. The laminate 16 is electrically coupled to at least one solderable pad 34. Accordingly, an over molding layer 35 is also required to protect the bonding wire 33. As a result, the 3D packaging solution 30 may have an increased height as compared to the height of the 2D packaging solution 10 of FIG. 1A. In this regard, FIG. 1C is a schematic diagram of an exemplary 3D packaging solution 36 configured to have a reduced height as compared to the height of the 3D packaging solution 30 of FIG. 1B by eliminating the bonding wire 33 and the over molding layer 35. Common elements between FIGS. 1A and 1C are shown therein with common element numbers and will not be re-described herein.

As illustrated in FIG. 1C, a MEMS device 38 is provided on a conductive stack(s) 40 that is conductively bonded to the MEMS substrate 12. The conductive stack(s) 40 is electrically coupled to conductive bonding structures 42(1)-42(4), which are electrically coupled to the ASIC 14 by at least one conductive via 44. By utilizing the at least one conductive via 44 in the cap wafer 18, it is possible to eliminate the bonding wire 33 and the over molding layer 35 in the 3D packaging solution 30 of FIG. 1B by implementing wafer level chip scale packaging (WLCSP) bumps 45, thus having a reduced height in the 3D packaging solution 36 as compared to the height of the 3D packaging solution 30.

SUMMARY OF THE INVENTION

Aspects disclosed in the detailed description include a glass wafer assembly. In one aspect, the glass wafer assembly comprises a first glass wafer and a second glass wafer that are bonded by a conductive sealing ring. The conductive sealing ring defines a substantially hermetically sealed cavity between the first glass wafer and the second glass wafer. In another aspect, the first glass wafer and the second glass wafer each comprise a plurality of conductive through glass vias (TGVs). At least one active device is disposed in the substantially hermetically sealed cavity and can be electrically coupled to a conductive TGV in the first glass wafer and a conductive TGV in the second glass wafer to enable flexible electrical routing through the glass wafer assembly without wire bonding and over molding. As a result, it is possible to reduce footprint and height while improving radio frequency (RF) performance of the glass wafer assembly.

In another aspect of the present invention, a glass wafer assembly is provided. The glass wafer assembly comprises a first glass wafer comprising an upper surface, a lower surface, and a plurality of first conductive TGVs that extend from the upper surface to the lower surface of the first glass wafer. The glass wafer assembly also comprises a second glass wafer comprising an upper surface, a lower surface, and a plurality of second conductive TGVs that extend from the upper surface to the lower surface of the second glass wafer. The glass wafer assembly also comprises at least one active device provided on the upper surface of the second glass wafer. The glass wafer assembly also comprises a sealing ring formed by a conductive sealing structure and disposed between the lower surface of the first glass wafer and the upper surface of the second glass wafer. The sealing ring encapsulates the at least one active device to define a substantially hermetically sealed cavity. The at least one active device is electrically coupled to a first conductive TGV among the plurality of second conductive TGVs comprised in the second glass wafer.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention and, together with the description, serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Aspects disclosed in the detailed description include a glass wafer assembly. In one aspect, the glass wafer assembly comprises a first glass wafer and a second glass wafer that are bonded by a conductive sealing ring. The conductive sealing ring defines a substantially hermetically sealed cavity between the first glass wafer and the second glass wafer. In another aspect, the first glass wafer and the second glass wafer each comprise a plurality of conductive through glass vias (TGVs). At least one active device is disposed in the substantially hermetically sealed cavity and can be electrically coupled to a conductive TGV in the first glass wafer and a conductive TGV in the second glass wafer to enable flexible electrical routing through the glass wafer assembly without wire bonding and over molding. As a result, it is possible to reduce footprint and height while improving radio frequency (RF) performance of the glass wafer assembly.

Figure 1A:
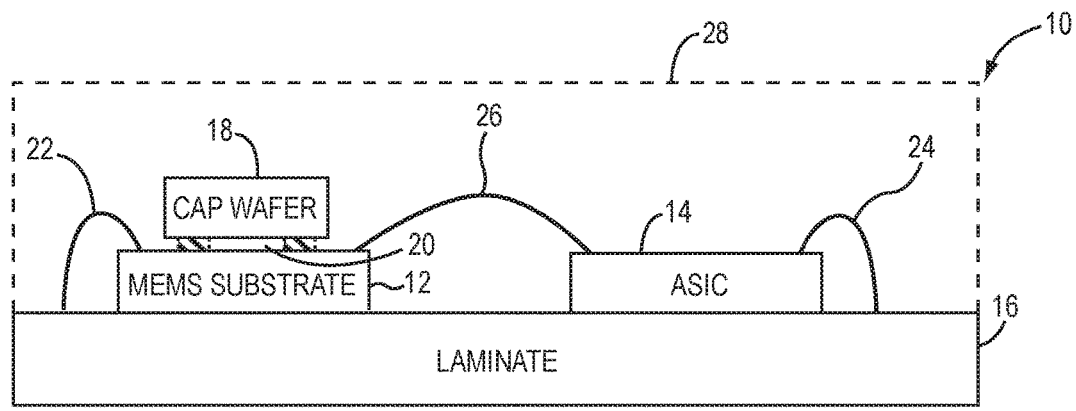
FIG. 1A is a schematic diagram of an exemplary two-dimensional (2D) packaging solution comprising a micro-electro-mechanical system (MEMS) substrate disposed side-by-side of an application-specific integrated circuit (ASIC)
Figure 1B:
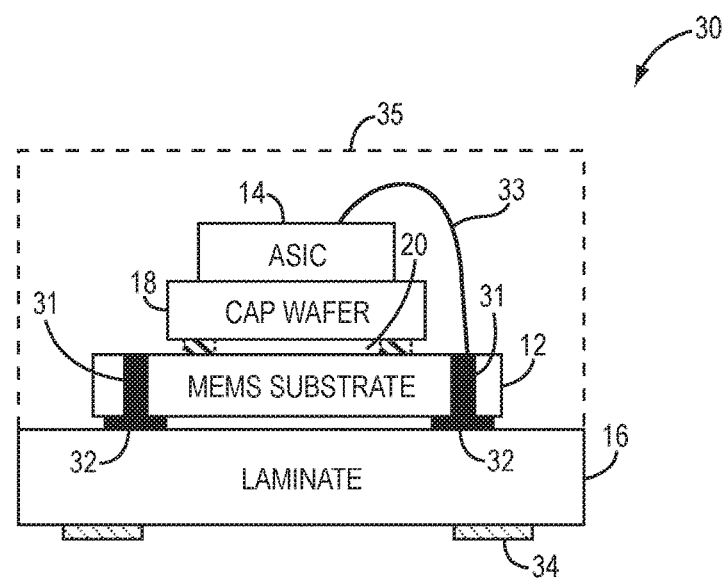
FIG. 1B is a schematic diagram of an exemplary three-dimensional (3D) packaging solution, wherein the MEMS substrate and the ASIC of FIG. 1A are stacked to have a reduced footprint as compared to the footprint of the 2D packaging solution of FIG. 1A.
Figure 1C:
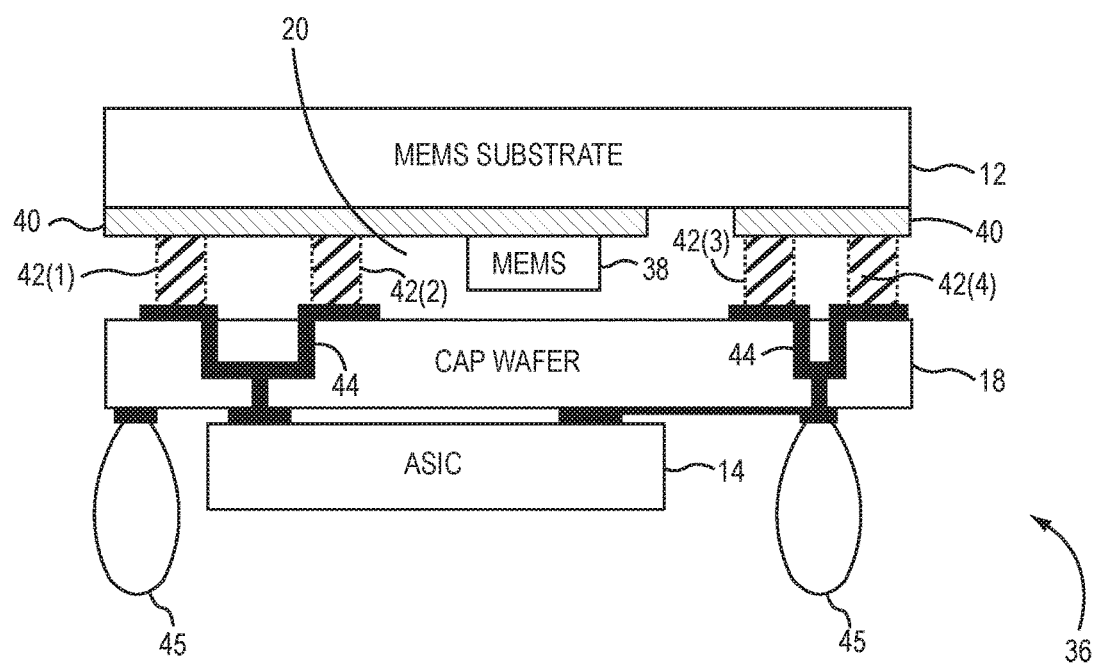
FIG. 1C is a schematic diagram of an exemplary 3D packaging solution configured to have a reduced height as compared to the height of the 3D packaging solution of FIG. 1B by eliminating a bonding wire and an over molding layer in the 3D packaging solution of FIG. 1B.

Although the three-dimensional (3D) packaging solution 36 of FIG. 1C allows the micro-electro-mechanical system (MEMS) device 38 to be electrically coupled to the application-specific integrated circuit (ASIC) 14 through the at least one conductive via 44, it remains challenging to electrically couple the MEMS device 38 to an external signal path (not shown) without the use of the WLCSP bumps 45, on the cap wafer 18. The use of the WLCSP bumps 45 substantially increases the footprint of the 3D packaging solution 36. Furthermore, the 3D packaging solution 36 requires underfill and/or overmolding that can increase the cost of the 3D packaging solution 36.

Figure 2:
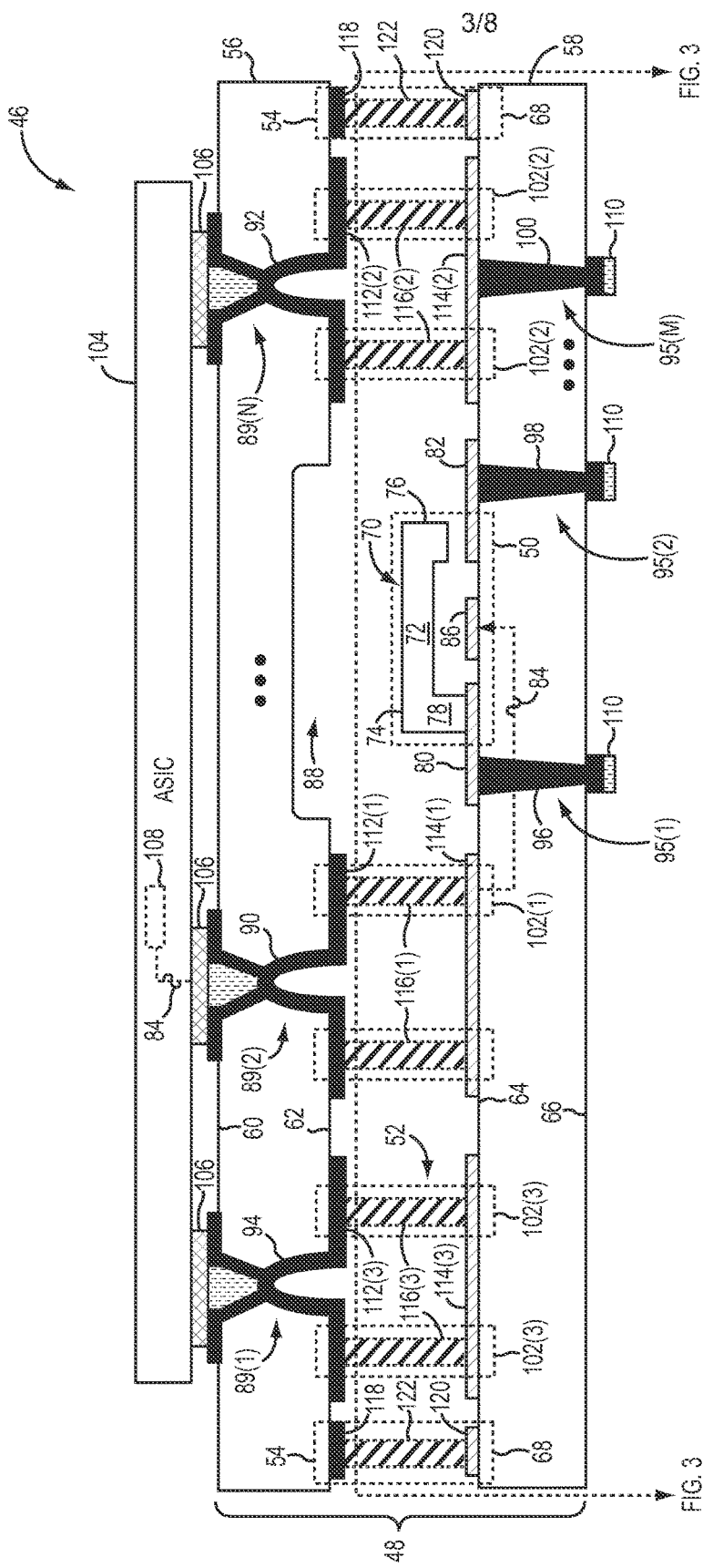
FIG. 2 is a schematic diagram of an exemplary 3D packaging solution comprising a glass wafer assembly configured to improve electrical coupling of an active device encapsulated in a cavity that is substantially hermetically sealed by a sealing ring between a first glass wafer and a second glass wafer.

In this regard, FIG. 2 is a schematic diagram of an exemplary 3D packaging solution 46 comprising a glass wafer assembly 48 configured to improve electrical coupling of at least one active device 50 encapsulated in a cavity 52 that is substantially hermetically sealed by a sealing ring 54 between a first glass wafer 56 and a second glass wafer 58. In a non-limiting example, the first glass wafer 56 and the second glass wafer 58 have approximate thicknesses of one hundred micro meters (100 μm) and two hundred micro meters (200 μm), respectively. The first glass wafer 56 comprises an upper surface 60 and a lower surface 62. The second glass wafer 58 comprises an upper surface 64 and a lower surface 66. In a non-limiting example, the first glass wafer 56 is positioned above the second glass wafer 58. In this regard, the first glass wafer 56 and the second glass wafer 58 serve as a glass cap wafer and a glass MEMS substrate for the glass wafer assembly 48, respectively.

The sealing ring 54, which is formed by a conductive sealing structure 68, is disposed between the lower surface 62 of the first glass wafer 56 and the upper surface 64 of the second glass wafer 58. Hence, the sealing ring 54 defines the cavity 52 that is substantially hermetically sealed between the lower surface 62 of the first glass wafer 56 and the upper surface 64 of the second glass wafer 58. In a non-limiting example, the cavity 52 is generally filled with an inert gas and sealed.

In a non-limiting example, the at least one active device 50 may be a metal-oxide semiconductor field-effect transistor (MOSFET), a bipolar junction transistor (BJT), an electrical coupler, a capacitor, a diode, a multiplexer, or a resonant stub. In another non-limiting example, the active device 50 is a MEMS device 70. The MEMS device 70 is formed on the upper surface 64 of the second glass wafer 58. The MEMS device 70 comprises a movable member, such as a cantilever 72, which is formed from a conductive material, such as gold. The cantilever 72 has a first end 74 and a second end 76. The first end 74, which is also an anchor 78 of the MEMS device 70, is coupled to a first conductive stack 80 disposed on the upper surface 64 of the second glass wafer 58. In a non-limiting example, the first end 74 of the cantilever 72 may be electrically coupled to the first conductive stack 80 at or near the point where the cantilever 72 is anchored to the first conductive stack 80. The second end 76 is suspended over a second conductive stack 82. When the MEMS device 70 is activated by a control signal 84 applied to a third conductive stack 86 (actuator plate) disposed under the middle portion of the cantilever 72, the cantilever 72 moves the second end 76 into electrical contact with the second conductive stack 82. In a non-limiting example, the control signal 84 may be an electrostatic voltage that can create an electrical field (not shown) to move the cantilever 72 toward the second conductive stack 82, thus moving the second end 76 into electrical contact with the second conductive stack 82. In another non-limiting example, a recessed area 88 may be provided on the lower surface 62 of the first glass wafer 56 and vertically above the MEMS device 70 to accommodate fabrication and movements of the cantilever 72.

With continuing reference to FIG. 2, the first glass wafer 56 comprises a plurality of first conductive TGVs 89(1)-89(N) that extend from the upper surface 60 to the lower surface 62 of the first glass wafer 56. In a non-limiting example, a TGV is a hole that penetrates a glass wafer, such as the first glass wafer 56. When the TGV is filled with conductive materials, the TGV becomes a conductive TGV. In this regard, the plurality of first conductive TGVs 89(1)-89(N) is filled with conductive materials. For the convenience of illustration, the first glass wafer 56 is shown herein with a first conductive TGV 90, a second conductive TGV 92, and a third conductive TGV 94 as a non-limiting example. The second glass wafer 58 comprises a plurality of second conductive TGVs 95(1)-95(M) that extend from the upper surface 64 to the lower surface 66 of the second glass wafer 58. For the same reason of convenience, the second glass wafer 58 is shown herein with a first conductive TGV 96, a second conductive TGV 98, and a third conductive TGV 100 as another non-limiting example. The first conductive TGV 90, the second conductive TGV 92, and the third conductive TGV 94 of the first glass wafer 56 are coupled to the second glass wafer 58 by conductive bonding structures 102(1)-102(3), respectively. In a non-limiting example, the conductive bonding structures 102(1)-102(3) are separated from the conductive sealing structure 68 and encapsulated in the sealing ring 54. As is further illustrated in reference to FIG. 4A below, the conductive bonding structures 102(1)-102(3) are formed with the same conductive material as the conductive sealing structure 68. The first conductive TGV 90, the second conductive TGV 92, and the third conductive TGV 94 of the first glass wafer 56, as well as the first conductive TGV 96, the second conductive TGV 98, and the third conductive TGV 100 of the second glass wafer 58 are filled with conductive materials that are further illustrated in reference to FIGS. 4B and 4C below.

With continuing reference to FIG. 2, the 3D packaging solution 46 further comprises an ASIC 104. In a non-limiting example, the ASIC 104 is provided on the upper surface 60 of the first glass wafer 56. The ASIC 104 is electrically coupled to the first conductive TGV 90, the second conductive TGV 92, and the third conductive TGV 94 of the first glass wafer 56 by at least one solderable pad 106 that resides on the upper surface 60 of the first glass wafer 56. In this regard, an active component 108 in the ASIC 104 may be electrically coupled to the third conductive stack 86 to provide the control signal 84 for activating the MEMS device 70 via the at least one solderable pad 106, the first conductive TGV 90 of the first glass wafer 56, and the conductive bonding structure 102(1).

In another non-limiting example, the first conductive TGV 96 and the second conductive TGV 98 of the second glass wafer 58 are coupled to the first conductive stack 80 and the second conductive stack 82, respectively. Further, the first conductive TGV 96, the second conductive TGV 98, and the third conductive TGV 100 of the second glass wafer 58 are electrically coupled to at least one solderable pad 110 that resides on the lower surface 66 of the second glass wafer 58. The at least one solderable pad 110 may be coupled to a substrate (not shown) that comprise at least one active component (e.g., an RF device) (not shown). In this regard, the MEMS device 70, when activated by the control signal 84, can be electrically coupled to the at least one active component in the substrate via the first conductive TGV 96, the second conductive TGV 98, and the at least one solderable pad 110.

The second conductive TGV 92 of the first glass wafer 56 is electrically coupled to the third conductive TGV 100 of the second glass wafer 58 by the conductive bonding structure 102(2), thus enabling direct electrical coupling between the ASIC 104 and the at least one solderable pad 110 residing on the lower surface 66 of the second glass wafer 58. In a non-limiting example, the second conductive TGV 92 of the first glass wafer 56 is substantially vertically aligned with the third conductive TGV 100 of the second glass wafer 58 to minimize wiring distance between the ASIC 104 and the at least one solderable pad 110. Understandably, it is possible to reduce heat and RF interferences in the 3D packaging solution 46 by reducing the wiring distance between the ASIC 104 and the at least one solderable pad 110.

The third conductive TGV 94 of the first glass wafer 56 is electrically coupled to the upper surface 64 of the second glass wafer 58 by the conductive bonding structure 102(3). However, the third conductive TGV 94 is electrically isolated from the first conductive TGV 96, the second conductive TGV 98, and the third conductive TGV 100 of the second glass wafer 58. This arrangement allows electrical signals (not shown) originating from the ASIC 104 to be provided to and terminated at an active device (not shown) disposed in the cavity 52 without impacting any active component (not shown) disposed below the lower surface 66 of the second glass wafer 58.

The conductive bonding structure 102(1) comprises a respective conductive layer 112(1), a respective conductive stack 114(1), and a respective conductive connector 116(1). The conductive bonding structure 102(2) comprises a respective conductive layer 112(2), a respective conductive stack 114(2), and a respective conductive connector 116(2). The conductive bonding structure 102(3) comprises a respective conductive layer 112(3), a respective conductive stack 114(3), and a respective conductive connector 116(3). The respective conductive layers 112(1)-112(3) are disposed on the lower surface 62 of the first glass wafer 56. The respective conductive stacks 114(1)-114(3) are disposed on the upper surface 64 of the second glass wafer 58. The respective conductive connectors 116(1)-116(3) are disposed between the respective conductive layers 112(1)-112(3) and the respective conductive stacks 114(1)-114(3), respectively. Likewise, the conductive sealing structure 68 also comprises a conductive layer 118, a conductive stack 120, and a conductive connector 122. The conductive layer 118 is disposed on the lower surface 62 of the first glass wafer 56, the conductive stack 120 is disposed on the upper surface 64 of the second glass wafer 58, and the conductive connector 122 is disposed between the conductive layer 118 and the conductive stack 120.

Figure 3:
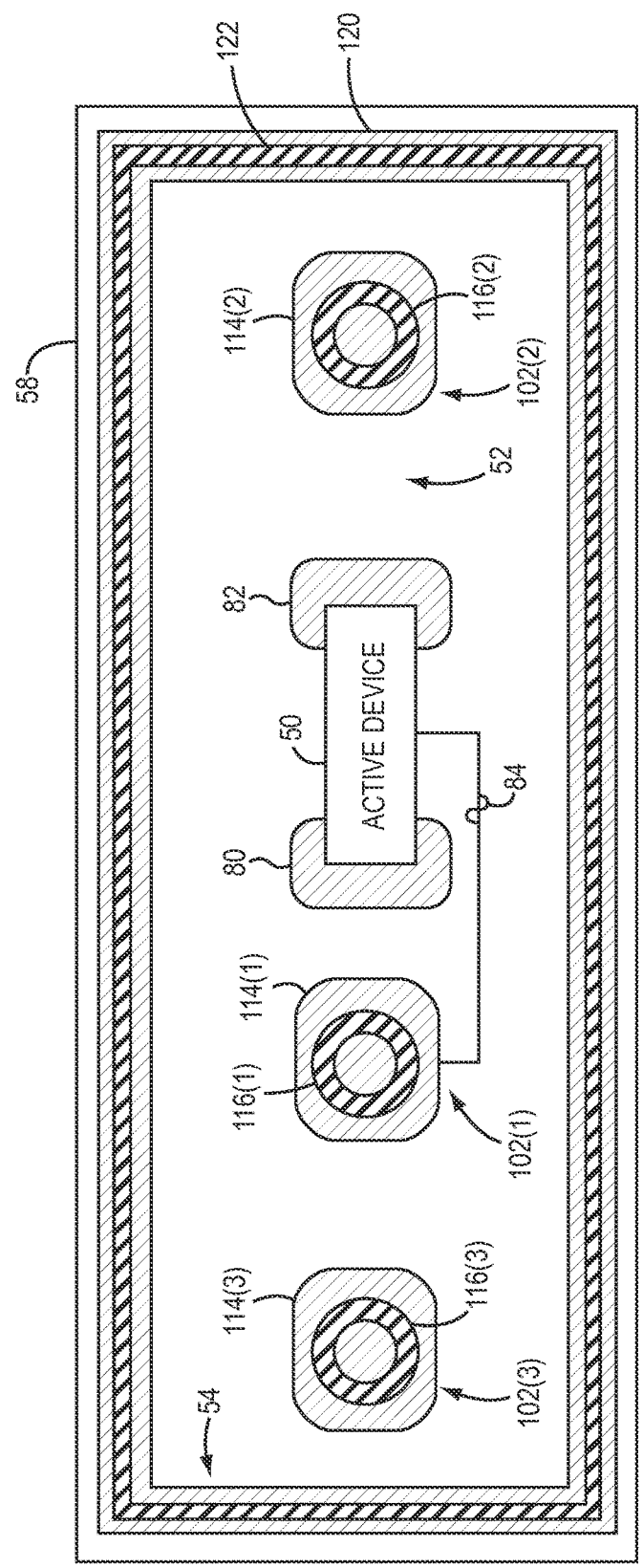
FIG. 3 is a top view of the second glass wafer of FIG. 2 providing an exemplary illustration of the sealing ring and the active device encapsulated in the cavity of FIG. 2.

FIG. 3 is a top view of the second glass wafer 58 providing an exemplary illustration of the sealing ring 54 and the active device 50 encapsulated in the cavity 52. Common elements between FIGS. 2 and 3 are shown therein with common element numbers and will not be re-described herein. In a non-limiting example, the sealing ring 54 may be formed along the outer edges of the first glass wafer 56 (not shown) and the second glass wafer 58, thus defining the cavity 52 that is substantially hermetically sealed. As illustrated in FIG. 3, the conductive stack 120 and the conductive connector 122 of the sealing ring 54 are separated from the respective conductive stacks 114(1)-114(3) and the respective conductive connectors 116(1)-116(3) of the conductive bonding structures 102(1)-102(3). In another non-limiting example, it is also possible to leave the conductive bonding structure 102(3) outside the cavity 52. In this regard, the geometry and location of the cavity 52 may be configured by disposing the sealing ring 54 with different geometries and in different sections of the second glass wafer 58.

Figure 4A:
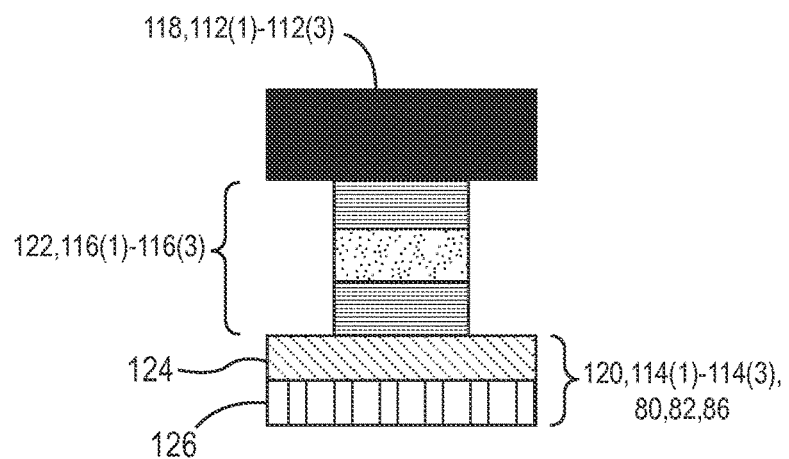
FIG. 4A is a schematic diagram providing an exemplary illustration of one or more conductive materials that form a conductive sealing structure and conductive bonding structures.
Figure 4B:
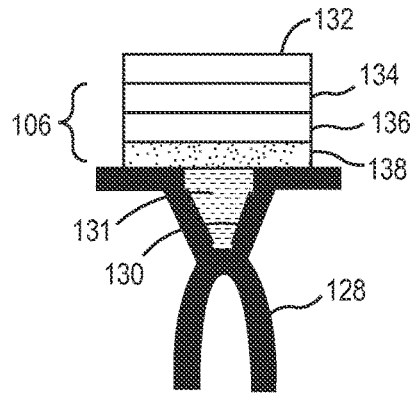
FIG. 4B is a schematic diagram providing an exemplary illustration of one or more conductive materials that form a plurality of conductive through-glass-vias (TGVs) of the first glass wafer and at least one solderable pad formed on an upper surface of the first glass wafer of FIG. 2.
Figure 4C:
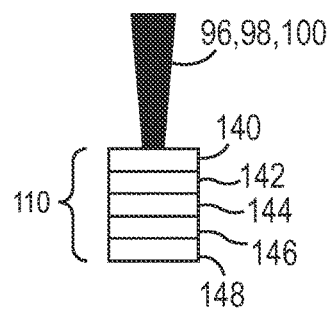
FIG. 4C is a schematic diagram providing an exemplary illustration of one or more conductive materials that form the plurality of conductive TGVs of the second glass wafer as well as at least one solderable pad formed on a lower surface of the second glass wafer of FIG. 2.

As discussed above in reference to FIG. 2, the first conductive TGV 90, the second conductive TGV 92, and the third conductive TGV 94 of the first glass wafer 56, as well as the first conductive TGV 96, the second conductive TGV 98, and the third conductive TGV 100 of the second glass wafer 58 are filled with conductive materials. Likewise, the conductive sealing structure 68 and the conductive bonding structures 102(1)-102(3) are also formed by respective conductive materials. Furthermore, the at least one solderable pads 106 and 110 are also formed by respective conductive materials. In this regard, FIGS. 4A, 4B, and 4C are provided below to provide exemplary illustrations of the respective conductive materials. Elements of FIG. 2 are referenced in connection with FIGS. 4A-4C and will not be re-described herein.

FIG. 4A is a schematic diagram providing an exemplary illustration of one or more conductive materials that form the conductive sealing structure 68 (not shown) and the conductive bonding structures 102(1)-102(3) (not shown) of FIG. 2. In a non-limiting example, the conductive layer 118 of the conductive sealing structure 68 and the respective conductive layers 112(1)-112(3) of the conductive bonding structures 102(1)-102(3) may be formed by gold runner metal with an approximate thickness of ten micro meters (10 μm). The conductive connector 122 of the conductive sealing structure 68 and the respective conductive connectors 116(1)-116(3) of the conductive bonding structures 102(1)-102(3) may be formed by a metal bond (e.g., a gold-tin metal bond) with an approximate thickness of three micro meters (3 μm). The conductive stack 120 of the conductive sealing structure 68 and the respective conductive stacks 114(1)-114(3) of the conductive bonding structures 102(1)-102(3) each comprise a top conductive stack layer 124 and a bottom conductive stack layer 126. The top conductive stack layer 124 is formed by switch metal (e.g., gold switch metal) with an approximate thickness of one tenth of a micro meter (0.1 μm). The bottom conductive stack layer 126 is formed by adhesion metal (e.g., tantalum adhesion metal) with an approximate thickness of 0.1 μm. The first conductive stack 80, the second conductive stack 82, and the third conductive stack 86 are formed by the same conductive materials as the conductive stack 120 of the conductive sealing structure 68 and the respective conductive stacks 114(1)-114(3) of the conductive bonding structures 102(1)-102(3).

FIG. 4B is a schematic diagram providing an exemplary illustration of one or more conductive materials that form the first conductive TGV 90 (not shown), the second conductive TGV 92 (not shown), and the third conductive TGV 94 (not shown) of the first glass wafer 56 (not shown), as well as the at least one solderable pad 106 of FIG. 2. In a non-limiting example, the first conductive TGV 90, the second conductive TGV 92, and the third conductive TGV 94 of the first glass wafer 56 each comprise a respective redistribution layer (RDL) 128 formed by gold runner metal with an approximate thickness of five micro meters (5 μm). The first conductive TGV 90, the second conductive TGV 92, and the third conductive TGV 94 of the first glass wafer 56 each comprise a respective adhesion layer 130 formed by titanium with an approximate thickness of five hundredths of a micro meter (0.05 μm). The first conductive TGV 90, the second conductive TGV 92, and the third conductive TGV 94 of the first glass wafer 56 are each filled using void-free copper 131. The at least one solderable pad 106 comprises a sputtered gold layer 132 with an approximate thickness of six hundredths of a micro meter (0.06 μm). The at least one solderable pad 106 also comprises a sputtered palladium layer 134 with an approximate thickness of 0.06 μm. The at least one solderable pad 106 also comprises a barrier layer 136 formed by nickel with an approximate thickness of four micro meters (4 μm). The at least one solderable pad 106 further comprises a plated layer 138 formed by copper with an approximate thickness of 4 μm. In a non-limiting example, the at least one solderable pad 106 may be formed simultaneously with the first conductive TGV 90, the second conductive TGV 92, and the third conductive TGV 94 of the first glass wafer 56.

FIG. 4C is a schematic diagram providing an exemplary illustration of one or more conductive materials that form the first conductive TGV 96, the second conductive TGV 98, and the third conductive TGV 100 of the second glass wafer 58 (not shown), as well as the at least one solderable pad 110 in FIG. 2. In a non-limiting example, the first conductive TGV 96, the second conductive TGV 98, and the third conductive TGV 100 of the second glass wafer 58 are copper-plated conductive TGVs. The at least one solderable pad 110 formed on the lower surface 66 of the second glass wafer 58 comprises a titanium adhesion layer 140 with an approximate thickness of 0.05 μm. The at least one solderable pad 110 also comprises a copper-plated layer 142 with an approximate thickness of 4 μm. The at least one solderable pad 110 also comprises a nickel-plated layer 144 with an approximate thickness of 4 μm. The at least one solderable pad 110 also comprises a sputtered palladium layer 146 with an approximate thickness of 0.06 μm. The at least one solderable pad 110 also comprises a sputtered gold layer 148 with an approximate thickness of 0.06 μm.

Figure 5:
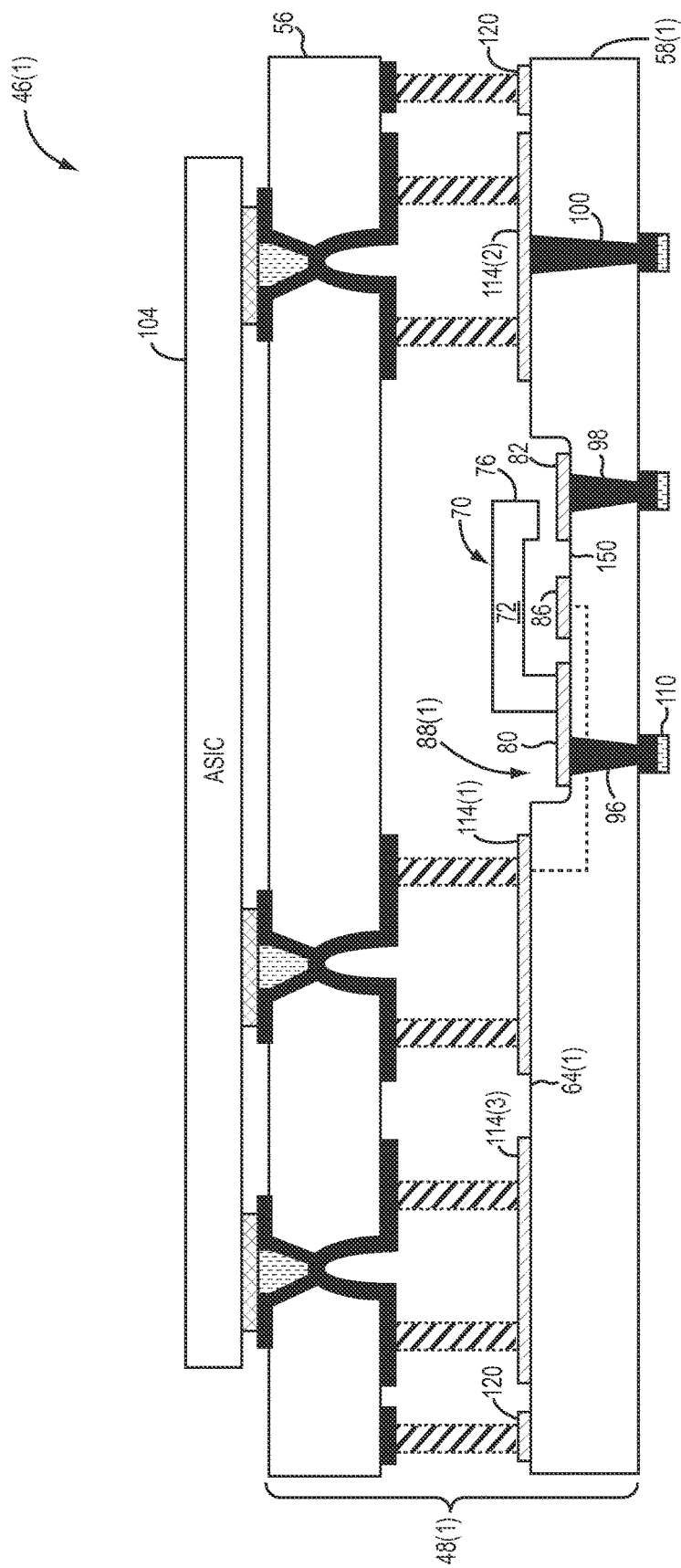
FIG. 5 is a schematic diagram of an exemplary 3D packaging solution comprising a glass wafer assembly with a recessed area provided on the upper surface of the second glass wafer of FIG. 2.

As previously discussed in FIG. 2, the recessed area 88 is provided on the lower surface 62 of the first glass wafer 56 and vertically above the MEMS device 70 to accommodate the fabrication and movements of the cantilever 72. It is also possible to provide the recessed area 88 on the upper surface 64 of the second glass wafer 58 to accommodate the fabrication and movements of the cantilever 72. In this regard, FIG. 5 is a schematic diagram of an exemplary 3D packaging solution 46(1) comprising a glass wafer assembly 48(1) with a recessed area 88(1) provided on an upper surface 64(1) of a second glass wafer 58(1). Common elements between FIGS. 2 and 5 are shown therein with common element numbers and will not be re-described herein. As illustrated in FIG. 5, the first conductive stack 80, the second conductive stack 82, and the third conductive stack 86 are provided on a recessed surface 150 of the second glass wafer 58(1). In this regard, the MEMS device 70 is disposed in the recessed area 88(1) to accommodate the fabrication and movements of the cantilever 72.

Figure 6:
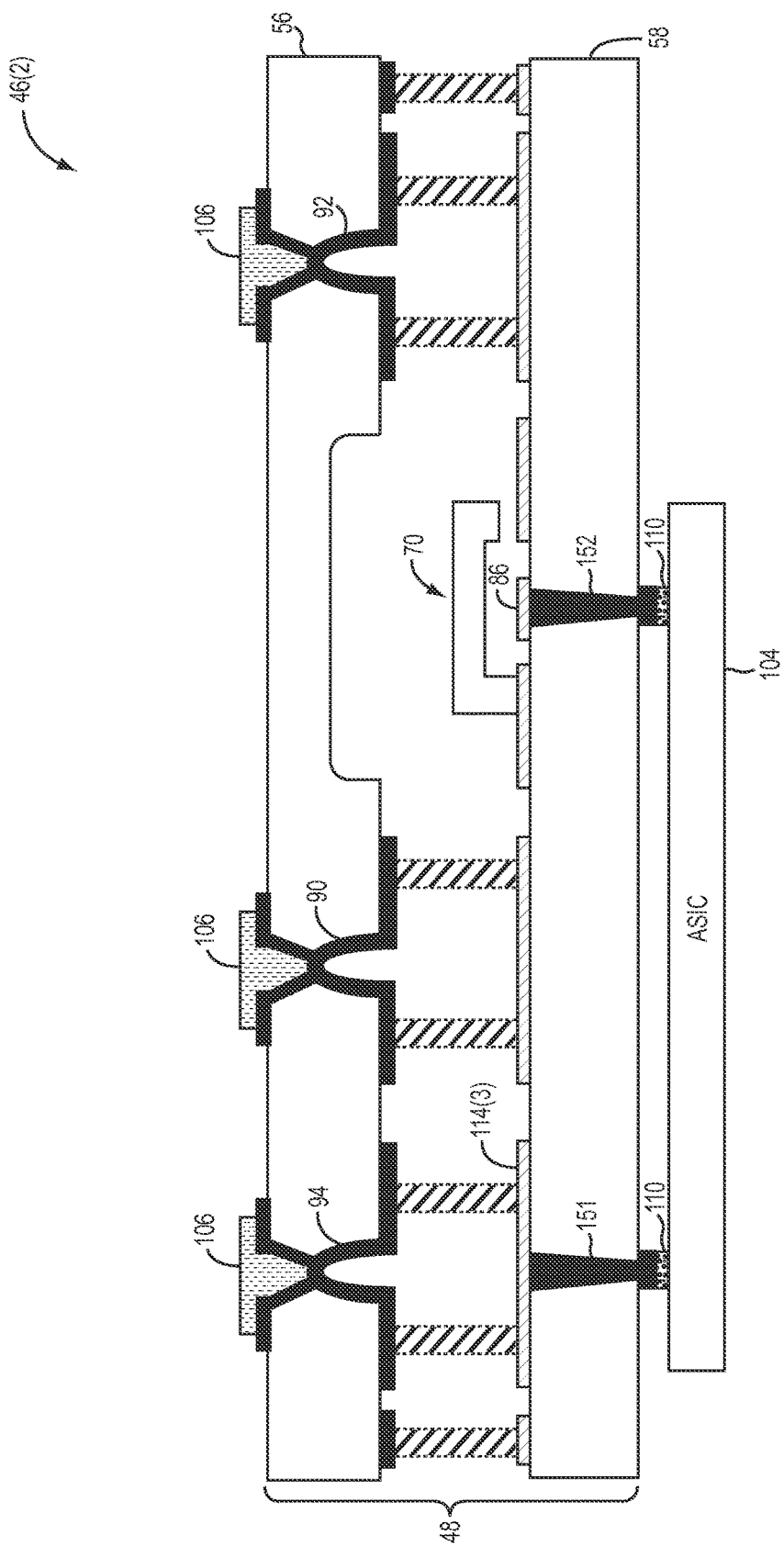
FIG. 6 is a schematic diagram of an exemplary 3D packaging solution comprising the glass wafer assembly of FIG. 2 with the ASIC provided underneath the glass wafer assembly.

In FIG. 2, the ASIC 104 is provided on top of the upper surface 60 of the first glass wafer 56. It is also possible to provide the ASIC 104 underneath the lower surface 66 of the second glass wafer 58. In this regard, FIG. 6 is a schematic diagram of an exemplary 3D packaging solution 46(2) comprising the glass wafer assembly 48 of FIG. 2 with the ASIC 104 provided underneath the lower surface 66 (not shown) of the second glass wafer 58. Common elements between FIGS. 2 and 6 are shown therein with common element numbers and will not be re-described herein. As illustrated in FIG. 6, the ASIC 104 is electrically coupled to a fourth conductive TGV 151 and a fifth conductive TGV 152 in the second glass wafer 58 by the at least one solderable pad 110. The fourth conductive TGV 151 in the second glass wafer 58 is electrically coupled to the third conductive TGV 94 in the first glass wafer 56 through the respective conductive stack 114(3). The fifth conductive TGV 152 is electrically coupled to the third conductive stack 86 (actuator plate) disposed under the middle portion of the cantilever 72 of the MEMS device 70.

Figure 7:
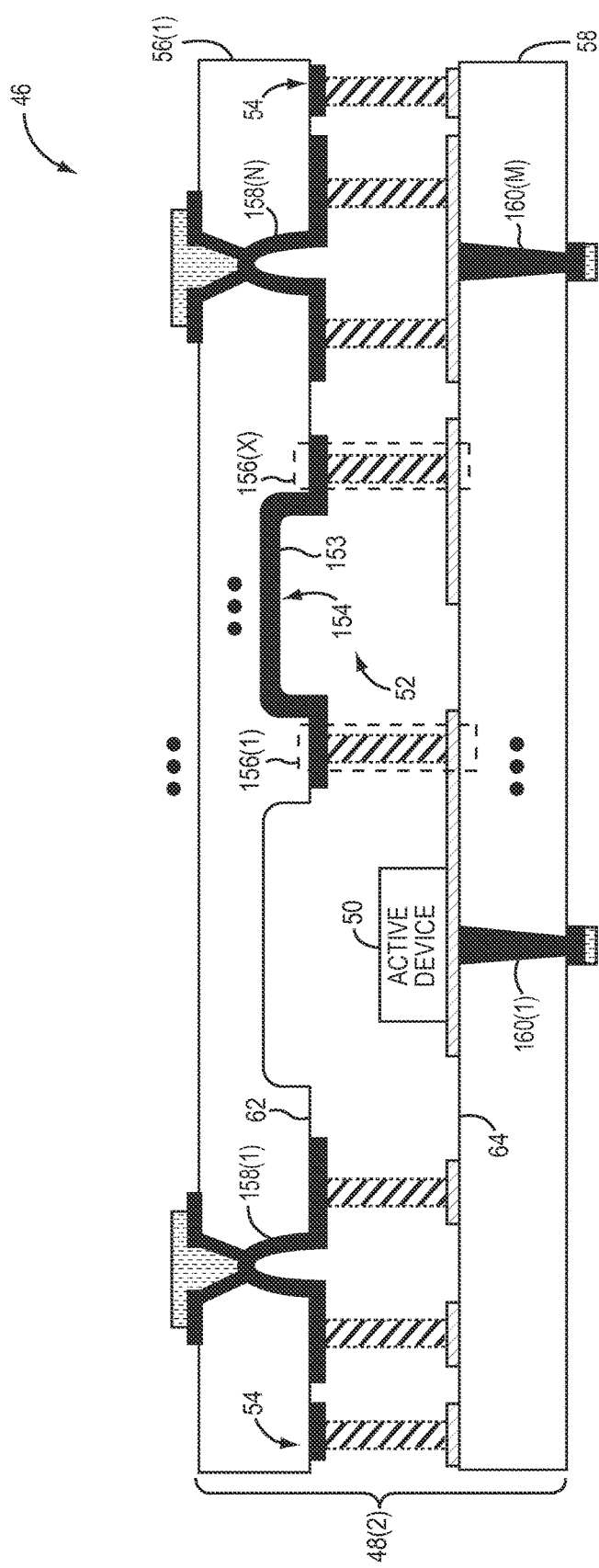
FIG. 7 is a schematic diagram of an exemplary glass wafer assembly comprising a metal trace for providing flexible electrical coupling inside the cavity of FIG. 2.

As discussed in FIG. 2, by providing the first conductive TGV 90, the second conductive TGV 92, and the third conductive TGV 94 in the first glass wafer 56 and the first conductive TGV 96, the second conductive TGV 98, and the third conductive TGV 100 in the second glass wafer 58, it is possible to provide electrical couplings between the first glass wafer 56 and the second glass wafer 58. It is also desirable to provide flexible electrical couplings between active components inside the cavity 52. In this regard, FIG. 7 is a schematic diagram of an exemplary glass wafer assembly 48(2) comprising a metal trace 153 for providing flexible electrical coupling inside the cavity 52 of FIG. 2. Common elements between FIGS. 2 and 7 are shown therein with common element numbers and will not be re-described herein.

In a non-limiting example, the metal trace 153 is disposed on the lower surface 62 of a first glass wafer 56(1). In another non-limiting example, the metal trace 153 is a metal layer disposed in a recessed area 154 of the lower surface 62 of the first glass wafer 56(1). The metal trace 153 is formed with copper, nickel, or gold and electrically coupled to one or more conductive bonding structures 156(1)-156(X) that are formed by the same conductive materials as the conductive bonding structures 102(1)-102(3) (not shown) of FIG. 2. In this regard, the metal trace 153 forms a conductive redistribution layer (not shown) inside the cavity 52 that is substantially hermetically sealed by the sealing ring 54. Hence, it is possible to provide a conductive route (not shown) from a plurality of conductive TGVs 158(1)-158(N) of the first glass wafer 56(1) to any of a plurality of conductive TGVs 160(1)-160(M) of the second glass wafer 58 with a metal bond. By providing the metal trace 153, it is possible to provide a simplified module design and improve performance of high throw count switch networks using the at least one active device 50. Furthermore, it is possible to use the redistribution layer provided by the metal trace 153 to form couplers, capacitors, stubs, or other RF passive components, thus further reducing the footprint of a 3D packaging solution.

Those skilled in the art will recognize various ways in which to configure actuation and release signals in light of the teachings herein. These variations are considered within the scope of this disclosure and the claims that follow.

Those skilled in the art will recognize improvements and modifications to the preferred embodiments of the present invention. All such improvements and modifications are considered within the scope of the concepts disclosed herein and the claims that follow.

What is claimed is:

1. A glass wafer assembly comprising:
   a first glass wafer comprising an upper surface, a lower surface, and a plurality of first conductive through glass vias (TGVs) that extend from the upper surface to the lower surface of the first glass wafer;
   a second glass wafer comprising an upper surface, a lower surface, and a plurality of second conductive TGVs that extend from the upper surface to the lower surface of the second glass wafer;
   at least one active device provided on the upper surface of the second glass wafer; and
   a sealing ring formed by a conductive sealing structure and disposed between the lower surface of the first glass wafer and the upper surface of the second glass wafer, the sealing ring encapsulating the at least one active device to define a substantially hermetically sealed cavity;
   wherein:
      the at least one active device is electrically coupled to a first conductive TGV among the plurality of second conductive TGVs comprised in the second glass wafer and a second conductive TGV of the plurality of first conductive TGVs is electrically coupled to a third conductive TGV of the plurality of second conductive TGVs,
      at least one of the plurality of first conductive TGVs is electrically coupled to an application-specific integrated circuit (ASIC) semiconductor that is mounted over the upper surface of the first glass wafer,
      the at least one active device is electrically coupled to a first conductive TGV of the plurality of first conductive TGVs,
      the at least one active device is electrically coupled to a first conductive stack, a second conductive stack, and a third conductive stack provided on the upper surface of the second glass wafer,
      the first conductive stack is electrically coupled to the first conductive TGV of the plurality of second conductive TGVs,
      the second conductive stack is electrically coupled to a second conductive TGV of the plurality of second conductive TGVs, and
      the third conductive stack is electrically coupled to the first conductive TGV of the plurality of first conductive TGVs.

2. The glass wafer assembly of claim 1 wherein the at least one active device is a micro-electro-mechanical system (MEMS) device.

3. The glass wafer assembly of claim 2 wherein the MEMS device comprises:
   an anchor electrically coupled to the first conductive stack provided on the upper surface of the second glass wafer and electrically coupled to the first conductive TGV among the plurality of second conductive TGVs;

a cantilever comprising a first end and a second end wherein:
  the first end is attached to the anchor and electrically coupled to the first conductive stack; and
  the second end is configured to be electrically coupled to the second conductive stack in response to the third conductive stack receiving a control signal from the first conductive TGV among the plurality of first conductive TGVs.

4. A glass wafer assembly comprising:
a first glass wafer comprising an upper surface, a lower surface, and a plurality of first conductive through glass vias (TGVs) that extend from the upper surface to the lower surface of the first glass wafer;
a second glass wafer comprising an upper surface, a lower surface, and a plurality of second conductive TGVs that extend from the upper surface to the lower surface of the second glass wafer;
at least one active device provided on the upper surface of the second glass wafer; and
a sealing ring formed by a conductive sealing structure and disposed between the lower surface of the first glass wafer and the upper surface of the second glass wafer, the sealing ring encapsulating the at least one active device to define a substantially hermetically sealed cavity;
wherein:
  the at least one active device is electrically coupled to a first conductive TGV among the plurality of second conductive TGVs comprised in the second glass wafer,
  a second conductive TGV of the plurality of first conductive TGVs is electrically coupled to a third conductive TGV of the plurality of second conductive TGVs, and
  the second conductive TGV of the plurality of first conductive TGVs is electrically coupled to the third conductive TGV of the plurality of second conductive TGVs by a respective conductive bonding structure formed from a conductive material that forms the conductive sealing structure.

5. The glass wafer assembly of claim 4 wherein the at least one active device is a micro-electro-mechanical system (MEMS) device.

* * * * *